United States Patent

Ido

[11] Patent Number: 5,998,986
[45] Date of Patent: Dec. 7, 1999

[54] METHOD OF CLEANING PROBE OF PROBE CARD AND PROBE-CLEANING APPARATUS

[75] Inventor: Yasuhiro Ido, Tokyo, Japan

[73] Assignee: Mitsubishi Denki Kabushiki Kaisha, Tokyo, Japan

[21] Appl. No.: 08/867,423

[22] Filed: Jun. 6, 1997

[30] Foreign Application Priority Data

Dec. 27, 1996 [JP] Japan .................................. 8-350165

[51] Int. Cl.$^6$ .............................. G01R 1/06; H05H 1/00; C23F 4/00; B08B 5/00
[52] U.S. Cl. ........................ 324/158.1; 134/1.1; 324/754; 216/70
[58] Field of Search .............................. 324/158.1, 71.1, 324/754; 134/1.1, 1.2; 216/69, 70; 204/192.32–192.34

[56] References Cited

U.S. PATENT DOCUMENTS

| | | | |
|---|---|---|---|
| 4,704,301 | 11/1987 | Bauer et al. ......................... | 134/1.2 X |
| 4,935,115 | 6/1990 | Chambaere et al. ................ | 204/192.32 |
| 4,983,255 | 1/1991 | Gruenwald et al. ................ | 134/1.1 |
| 5,242,561 | 9/1993 | Sato .................................... | 156/345 X |
| 5,310,452 | 5/1994 | Doki et al. .......................... | 204/192.32 |
| 5,359,282 | 10/1994 | Teii et al. ............................. | 324/71.1 |
| 5,666,063 | 9/1997 | Abercrombie et al. .............. | 324/754 |
| 5,716,878 | 2/1998 | Turner et al. ....................... | 324/754 X |
| 5,849,135 | 12/1998 | Selwyn ................................ | 156/345 |

FOREIGN PATENT DOCUMENTS 3-278438  12/1991  Japan .
6-37769   6/1994   Japan .

Primary Examiner—Gerard Strecker
Attorney, Agent, or Firm—Leydig, Voit & Mayer, Ltd.

[57] ABSTRACT

A method for cleaning probes of a probe card used for testing semiconductor wafers and an apparatus for carrying out the cleaning method. Microwave energy is supplied to and a magnetic field is impressed on a reaction gas to generate a plasma; a magnetic field source generates a magnetic field, funneling and directing the plasma toward a zone opposite a probe card; a baffle funnels the plasma toward a zone where probes of the probe card are present; and a voltage source impresses controlled DC voltages onto the probes so that the energy of ions incident on the probes exceeds a threshold energy for sputtering aluminum but not a threshold energy for sputtering tungsten.

8 Claims, 3 Drawing Sheets

METHOD OF CLEANING PROBE OF PROBE CARD AND PROBE-CLEANING APPARATUS

BACKGROUND OF THE INVENTION

1. Field of the Invention

The present invention relates to a method for cleaning a probe of a probe card used for testing semiconductor wafers, and an apparatus for carrying out the method.

2. Description of the Related Art

In general, as disclosed in Japanese Unexamined Patent Publication No. 3-278438 and shown in FIG. 4, a probe card 1 used for testing semiconductor wafers is connected to a tester 4 through a contact ring 3 with contact pins 2. Further, a plurality of tungsten probes 6 are embedded in the lower portion of the probe card 1 so as to correspond to the number and positions of pads 5a of a semiconductor wafer 5 to be tested. On performing a predetermined test, a stage 7 on which the semiconductor wafer 5 is placed is raised from beneath the probe card 1, and the semiconductor wafer 5 is electrically connected to the tester 4 by contacting the pads 5a of the semiconductor wafer 5 to the probes 6 of the probe card 1, respectively.

When such a test is repeated, for example, aluminum as the material for the pads 5a adheres to probes 6, and the adhering aluminum is oxidized to form insulating surface coatings on the probes, which can render the test less reliable by inhibiting electrical contact. To avoid this, a non-illustrated cleaning apparatus is usually disposed near the testing apparatus, and the probes 6 are mechanically polished with the cleaning apparatus to remove aluminum adhering to the probes.

Hitherto, since probes 6 of such a probe card 1 are cleaned according to mechanical polishing using a cleaning apparatus as described above, the probes 6 are frequently deformed due to the application of forces to the probes 6 during polishing, so the probes 6 do not correspond to the positions of pads 5 of a semiconductor wafer 5 any longer, and, as a result, the electrical contact between the probes and the pads becomes imperfect. Accordingly, reliability in testing wafers is still reduced even if the probes are cleaned.

SUMMARY OF THE INVENTION

The present invention has been accomplished in order to solve the above-mentioned problems, and its object is to provide a method for cleaning probes of a probe card and an apparatus for carrying out the cleaning method, with which reliability in testing wafers can be improved.

Aiming at achieving the above-described object, an aspect of the present invention is a method for cleaning probes of a probe card comprising steps of:

feeding a reaction gas into a vacuum chamber containing the probe card, and generating plasma by impressing microwave energy and a magnetic field; and impressing DC voltages onto the probes of the probe card while controlling the values of the DC voltages such that the value of energy derived from plasma ions incident onto the probes falls within a range between the threshold energy value for causing aluminum sputtering and that for causing tungsten sputtering.

In the above-described method, the reaction gas may be Ar, and alternatively may be He.

Additionally, another aspect of the present invention is an apparatus for cleaning probes of a probe card comprising:

a probe card holding means which is disposed in a vacuum chamber and holds the probe card;

a reaction gas feeding means for feeding a reaction gas into the vacuum chamber;

a plasma generating means which impresses microwave energy and a magnetic field onto the reaction gas to generate plasma;

a magnetic field generating means which generates a magnetic field to funnel and direct the plasma toward a zone above the probe card;

a baffle means for funneling the directed plasma to a zone where the probes of the probe card are present; and an impressed voltage controlling means which impresses DC voltages onto the probes of the probe card while controlling the values of the DC voltages such that the energy of plasma ions incident onto the probes falls within a range between the threshold energy value for causing aluminum sputtering and that for causing tungsten sputtering.

In the above-described apparatus, the baffle means may be disposed so as to be movable along the direction of plasma radiation.

Further, the probe card holding means may be disposed with a cooling means.

DESCRIPTION OF THE PREFERRED EMBODIMENT

EMBODIMENT 1

Figure 1:
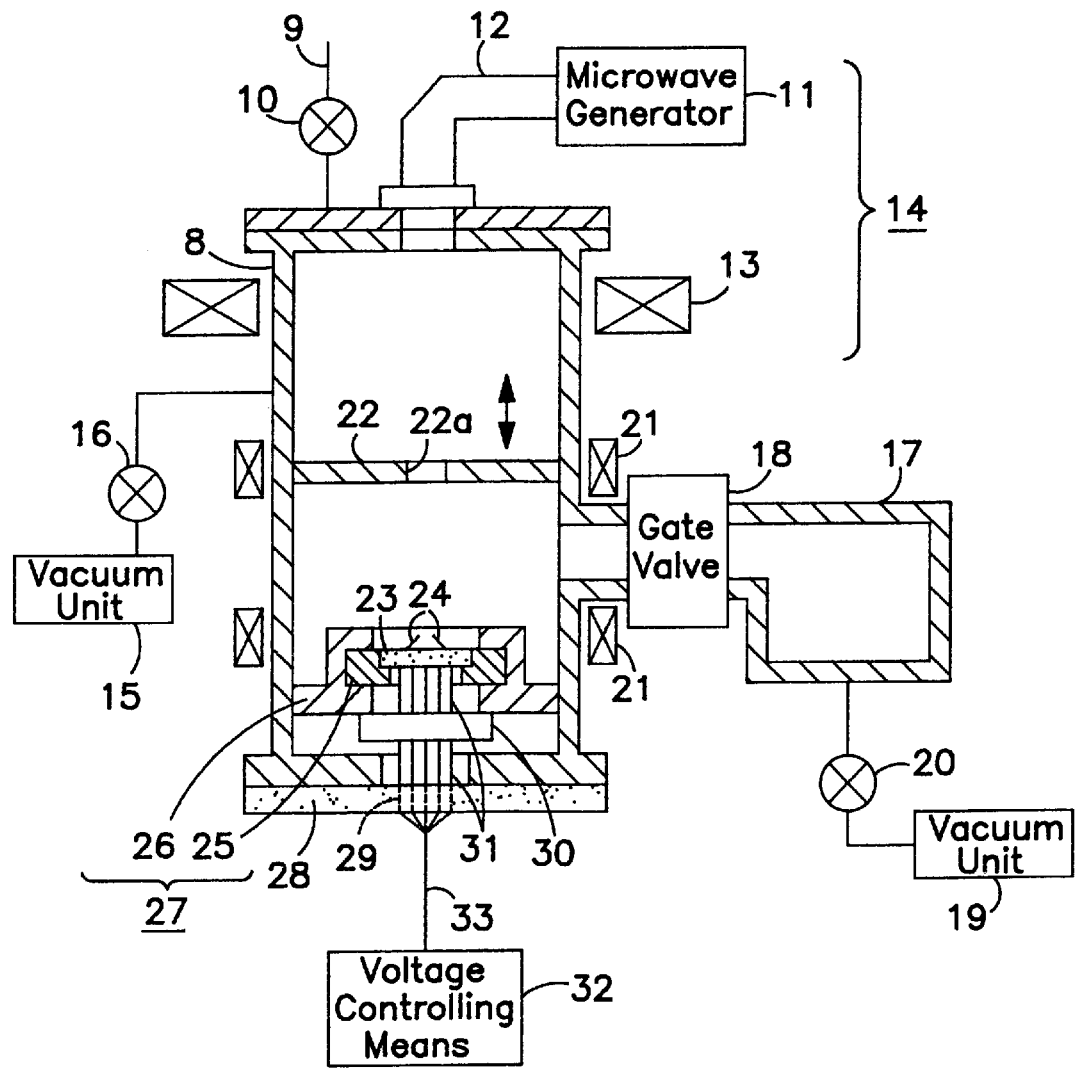
FIG. 1 is a schematic sectional view showing the structure of an apparatus for cleaning probes of a probe card according to Embodiment 1 of the present invention.
Figure 2:
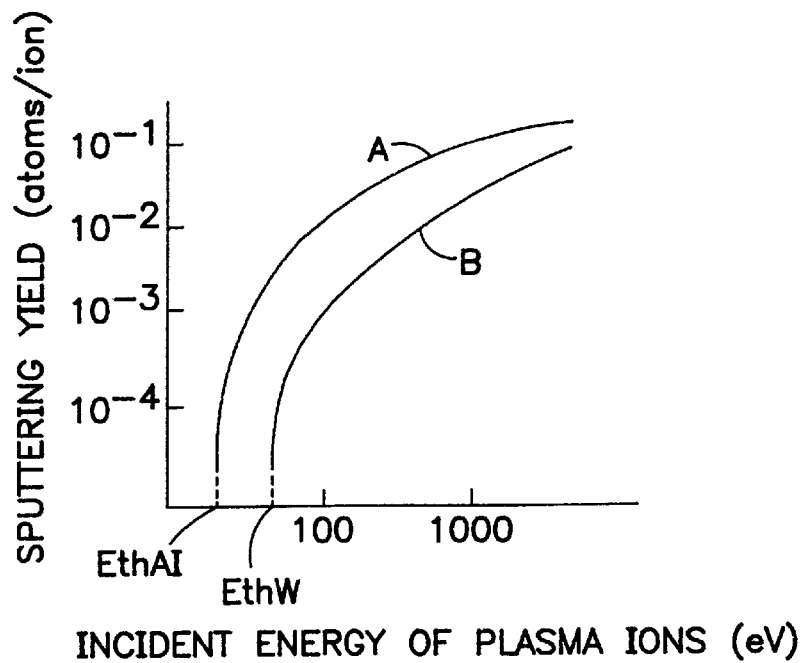
FIG. 2 is a characteristic diagram for illustration of the principle of the present invention.
Figure 3:
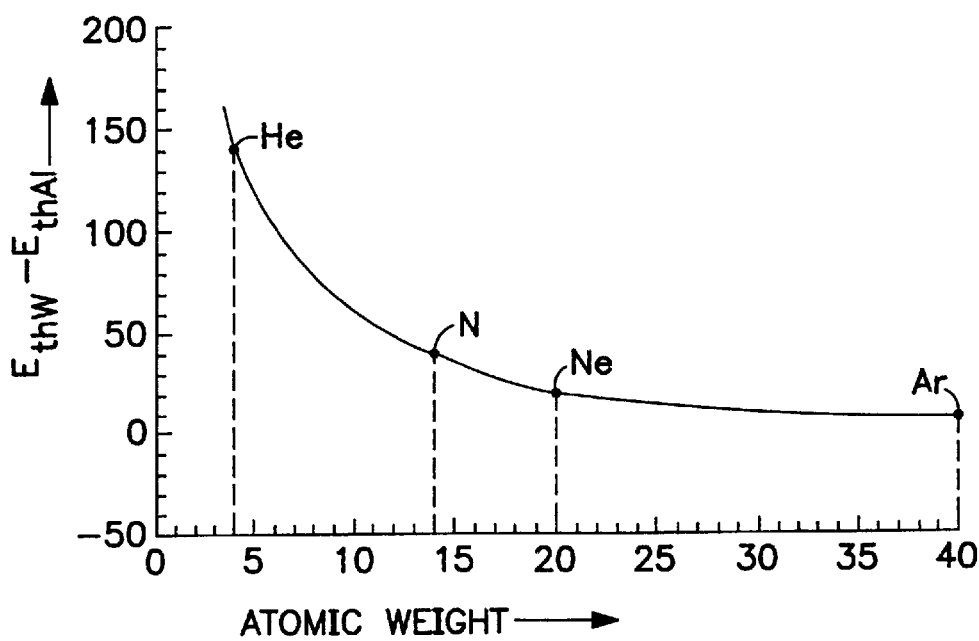
FIG. 3 is a characteristic diagram showing the difference in threshold energy values for sputtering between tungsten and aluminum when a plasma gas is altered.
Figure 4:
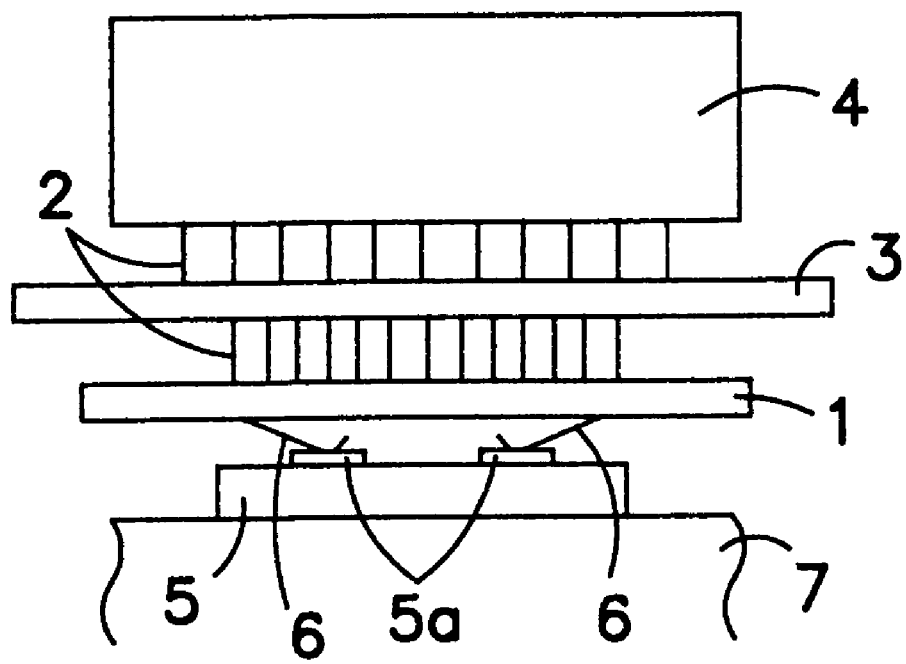
FIG. 4 is a schematic front view showing the general structure of a system card for testing semiconductor wafers using a probe.

FIG. 1 is a schematic sectional view showing the structure of an apparatus of this embodiment for cleaning probes of a probe card according to the present invention;

FIG. 2 is a characteristic diagram for illustration of the principle of the present invention; and FIG. 3 is a characteristic diagram showing the difference in threshold energy values for sputtering between tungsten and aluminum when a plasma type is altered.

Initially, the base principal of the present invention will be illustrated below.

FIG. 2 shows the relationship between the sputtering yield and the energy of incident ions in a plasma. In this figure, curve A shows changes in the sputtering yield of aluminum, and curve B shows changes in the sputtering yield of tungsten which is the material of the probes. Incidentally, sputtering yield is the number of material atoms discharged by sputtering when one ion in a plasma collides with the solid material. Further, "EthAl" and "EthW" in the figure indicate the threshold energy value for sputtering aluminum and that for sputtering tungsten, respectively, and ions having energy of less than these values cannot cause a sputtering reaction.

Since tungsten has a larger mass than aluminum, tungsten is sputtered less readily than aluminum, and, therefore, the relationship EthAl>EthW holds. Accordingly, if a DC voltage is impressed on probes while being controlled such that the plasma ion energy incident on the probes falls within a range between EthAl and EthW, the plasma ion energy will be insufficient for sputtering tungsten, and only aluminum is discharged and removed by sputtering.

The apparatus used in Embodiment 1 for cleaning probes of a probe card according to the present invention, which is based on the above-described principle, will be described with reference to FIG. 1.

In FIG. 1, 8 indicates a vessel; 9 indicates a reaction gas feeding means which communicates with the inside of the vessel 8 through a valve 10 and feeds a reaction gas into the vessel 8; 11 indicates a microwave generator which generates microwave energy and introduces it into the vessel 8 through a wave guide 12; 13 indicates a magnetic field coil which impresses a magnetic field on the microwave energy derived from the microwave generator 11 to generate plasma; 14 indicates a plasma generating means comprising the microwave generator 11, the wave guide 12 and the magnetic field coil 13; and 15 is a first vacuum unit which communicates with the inside of the vessel 8 through a valve 16 and evacuates the vessel 8.

Further, 17 indicates an exchange vessel which communicates with the vessel 8 through a gate valve 18 and serves as a vessel for inserting and extracting probe; 19 is a second vacuum unit which communicates with the inside of the exchange vessel 17 through a valve 20 and evacuates the exchange vessel 17; 21 indicates a magnetic field generating means comprising a magnetic field coil which funnels and directs the plasma derived from the plasma generating means 14 toward a zone above the probe card; 22 indicates a baffle made of boron nitride which is disposed in the vessel 8 so as to be movable up and down as shown by the arrow, and further funnels and directs the plasma funneled by the magnetic field generating means 21 toward a zone where the probes of the probe card are present, through a illuminating hole 22a in a central portion of the baffle.

Moreover, 23 indicates a probe card having a plurality of probes 24; 25 indicates a metallic tray which holds the probe card 23 so that the card can be mounted thereon or removed therefrom at will, and can cool the held probe card 23 by passing cool water inside the tray, not illustrated; 26 indicates a holder which holds the metallic tray 25, and is part of a probe card holding means 27 together with the metallic tray 25; 28 is a substrate which is disposed beneath the vessel 8 and contains a plurality of embedded conductive rods 29; 30 is a contact ring which is disposed beneath the holder 26, has a plurality of contact pins 31, and electrically connects the probes 24 of the probe card 23 to the conductive rods 29 in the substrate 28 through the contact pins 31; and 32 indicates an impressed voltage controlling means which is electrically connected to the conductive rods 29 in the substrate 28 with leads 33, and individually impresses predetermined DC voltages onto the conductive rods 29 while individually controlling the voltages.

Operation of the apparatus for cleaning probes of a probe card having the above-described structure will be explained.

Initially, a probe card 23 is mounted on the metallic tray 25 and placed in the exchange vessel 17. The vessel 8 and the exchange vessel 17 are then evacuated to a vacuum by opening the valves 16 and 20, and respectively driving the first and second vacuum apparatus 15 and 19. Next, the gate valve 18 is opened, and the metallic tray 25 is transferred into the vessel 8 and held in the holder 26. Under such a situation, the valve 10 is opened and a predetermined amount of reaction gas such as He is fed into the vessel 8.

Subsequently, the microwave generator 11 is driven to generate microwave energy, and the generated microwave energy is introduced into the vessel 8 through the wave guide 12 while the magnetic field coil 13 is operated to generate a plasma by magnetic field impression. Next, a magnetic field perpendicular to the plasma is generated by the magnetic field generating means 21. Thus spreading of the plasma in directions perpendicular to the magnetic force lines is inhibited and the plasma is funneled and directed toward the zone where the probes 24 of the probe card 23 are present through the illuminating hole 22a in the baffle 22, and thus ions in the plasma are incident upon the probes 24, respectively.

At the same time, DC voltages are respectively impressed, while being controlled, on the probes 24 of the probe card 23 by the impressed voltage controlling means 32 through the contacting ring 30. When the DC voltages are controlled so that the plasma ion energy incident on the probes 24 falls within a range between the threshold energy for sputtering aluminum and that for sputtering tungsten, only aluminum adhering to the probes 24 is sputtered and removed according to the above-described principle, and thus the cleaning of one probe card 23 is completed.

After this, the cleaned probe card 23 is returned to the exchange vessel 17 together with the metallic tray 25 in a manner reverse to the process described above, another probe card 23 to be cleaned is newly mounted, and the same operation as described above is repeated to carry out continuous cleaning.

As described above, according to Embodiment 1, the plasma generated by the plasma generating means 14 is inhibited from spreading in directions perpendicular to the magnetic force lines by the magnetic field generating means 21, the plasma is funneled and directed toward the zone where the probes 24 are present through the illuminating hole 22a in the baffle 22, and thus the ions in the plasma are incident upon the probes 24. At the same time, DC voltages are individually impressed and controlled by the impressed voltage controlling means 32 so that the plasma ion energy incident on the probes 24 falls within a range between the threshold energy for sputtering aluminum and that for sputtering tungsten. Accordingly, aluminum adhering to the probes can be removed without damaging the probes. In addition, since non-contact cleaning is performed, the probes 24 will not be deformed to cause imperfect electrical contact, and thus reliability in testing wafers can be improved.

Additionally, the baffle 22 is disposed so as to be movable along the direction of plasma radiation, so the plasma can readily be directed toward the zone where the probes 24 are present. Further, since the metallic tray 25 in the probe card holding means 27 is formed so as to be cooled, the probe card 23 to be mounted thereon can also be cooled, and, therefore, thermal influence on the probe card 23 can also be prevented.

Incidentally, FIG. 3 shows differences between threshold energy values for sputtering of tungsten and those for sputtering aluminum when the plasma type is altered. As is shown in FIG. 3, N, Ne, Ar and other gases can also be used as the reaction gas although He was used as the reaction gas in the above description. However, as is obvious from FIG. 3, the difference between EthW and EthAl is larger in He which has a smaller atomic weight than in Ar which has a larger atomic weight. Accordingly, voltages can be easily controlled by the impressed voltage controlling means 32 when He is used as the reaction gas since a wider voltage controlling range can be achieved. Meanwhile, since the sputtering yield is larger in a case where Ar of a larger atomic weight is used rather than in a case where He of a smaller atomic weight is used, the use of Ar can reduce the time required to remove aluminum, namely, the cleaning time, and can improve work efficiency.

As described above, the cleaning method according to the present invention includes a step of feeding a reaction gas into a vacuum chamber containing a probe card, and generating a plasma by impressing microwave energy and a magnetic field; and a step of impressing DC voltages on the probes of the probe card, and controlling the voltage values so that the energy of the ions in the plasma incident on the probes falls within a range between the threshold energy value for sputtering aluminum and that for sputtering tungsten. Accordingly, there is provided a method for cleaning probes of a probe card (probe-cleaning method), improving reliability in testing wafers.

Further, a probe-cleaning method which can improve cleaning work efficiency as well as wafer-testing reliability can be provided by using Ar as the reaction gas.

Moreover, a probe-cleaning method which can naturally improve wafer-testing reliability and can be carried out with easy control of impressed DC voltages can be provided by using He as the reaction gas.

Additionally, the present invention provides an apparatus for cleaning probes of a probe card (probe-cleaning apparatus), the apparatus being capable of improving wafer-testing reliability and comprising a probe card holding means which is disposed in a vacuum chamber and holds the probe card, a reaction gas feeding means for feeding a reaction gas into the vacuum chamber, a plasma generating means which impresses microwave energy and a magnetic field to generate a plasma, a magnetic field generating means which generates a magnetic field to funnel and direct the plasma toward a zone above the probe card, a baffle for funneling the directed plasma to a zone where the probes of the probe card are present, and an impressed voltage controlling means which impresses DC voltages on the probes of the probe card while controlling the DC voltages such that the energy of ions of the plasma incident onto the probes falls within a range between the threshold energy value for causing aluminum sputtering and that for causing tungsten sputtering.

Further, a probe-cleaning apparatus which can naturally improve wafer-testing reliability and in which the plasma can easily be directed toward a desired zone can be provided by disposing the baffle so that it can move along the direction of plasma radiation.

Moreover, a probe-cleaning apparatus which can naturally improve wafer-testing reliability while preventing thermal influence on the probe card to be cleaned can be provided by forming the above-described probe card holding means so that it can be cooled.

What is claimed is:

1. A method for cleaning a metal probe of a probe card comprising:

feeding a reaction gas into a vacuum chamber containing a probe card including a metal probe contaminated with a metal different from that of the probe, and generating a plasma by impressing microwave energy and a magnetic field on the reaction gas; and impressing a DC voltage on the metal probe of the probe card while controlling the DC voltage such that ions in the plasma and incident on the metal probe have energies larger than a threshold energy for sputtering the metal contaminant and thereby removing, the metal contaminant from the metal probe, and smaller than a threshold energy for sputtering the metal of the metal probe whereby the metal contaminant is removed without damaging the metal probe.

2. The method for cleaning a metal probe of a probe card according to claim 1, wherein the reaction gas is Ar.

3. The method for cleaning a metal probe of a probe card according to claim 1, wherein reaction gas is He.

4. An apparatus for cleaning a metal probe of a probe card comprising:

a vacuum chamber;

probe card holding means disposed in the vacuum chamber for holding a probe card having a metal probe contaminated with a metal different from that of the probe;

a reaction gas feeding means for feeding a reaction gas into the vacuum chamber;

plasma generating means for supplying microwave energy to and impressing a magnetic field on the reaction gas to generate a plasma;

magnetic field generating means for generating a magnetic field for funneling and directing the plasma toward a zone opposite the probe card;

a baffle for funneling the plasma to a zone where the metal probe of the probe card is present; and impressed voltage controlling means for impressing a DC voltage on the metal probe of the probe card while controlling the DC voltage such that ions in the plasma incident on the probe have energies larger than a threshold energy for sputtering the metal contaminant and thereby removing the metal contaminant from the metal probe, and smaller than a threshold energy for sputtering the metal of the metal probe whereby the metal contaminant is removed without damaging the metal probe.

5. The apparatus for cleaning a metal probe of a probe card according to claim 4, wherein the baffle can move along a direction of plasma radiation.

6. The apparatus for cleaning a metal probe of a probe card according to claim 4, including means for cooling the probe card holding means.

7. The method for cleaning a metal probe of a probe card according to claim 1, wherein the metal contaminant is aluminum and the metal of the metal probe is tungsten.

8. The apparatus for cleaning a metal probe of a probe card according to claim 4, wherein the metal contaminant is aluminum and the metal of the metal probe is tungsten.

* * * * *